United States Patent [19]
Wong

[11] Patent Number: 5,849,680
[45] Date of Patent: Dec. 15, 1998

[54] CLEANING WITH LIMONENE, BHT, AND ACETYLACETONATE

[75] Inventor: Ching-Ping Wong, Norcross, Ga.

[73] Assignee: Lucent Technologies Inc., Murray Hill, N.J.

[21] Appl. No.: 741,984

[22] Filed: Oct. 31, 1996

[51] Int. Cl.$^6$ ............... B08B 3/08; C11D 7/24; C11D 7/26; C11D 7/60
[52] U.S. Cl. ............... 510/175; 134/2; 134/40; 134/42; 510/255; 510/258
[58] Field of Search .................. 134/2, 40, 42; 510/175, 176, 255, 258

[56] References Cited

U.S. PATENT DOCUMENTS

| | | | |
|---|---|---|---|
| 4,471,152 | 9/1984 | Doyle et al. | 585/848 |
| 4,511,488 | 4/1985 | Matta | 252/162 |
| 4,640,719 | 2/1987 | Hayes et al. | 134/40 |
| 4,867,800 | 9/1989 | Dishart et al. | 134/40 |
| 5,116,426 | 5/1992 | Asano et al. | 134/40 |
| 5,300,154 | 4/1994 | Ferber et al. | 134/26 |
| 5,330,673 | 7/1994 | Bayless | 252/171 |
| 5,393,448 | 2/1995 | Winston et al. | 252/109 |
| 5,514,294 | 5/1996 | Bohnert et al. | 252/170 |
| 5,573,710 | 11/1996 | McDonell | 510/405 |
| 5,614,032 | 3/1997 | Wong | 134/38 |

FOREIGN PATENT DOCUMENTS

| 675675 | 10/1995 | European Pat. Off. . |
|---|---|---|
| 3239693 | 5/1984 | Germany . |

OTHER PUBLICATIONS

ACS Registry No. 128–37–0, Month not known–1998.
Wong, C.P., et al., "Reactions of high lead solders with BIOACT EC–7R", Proc.–Electron. Compon. Technol. Conf., 45th, 1016–27, Month not known–1995.
Marino, Frank A., "Environmental, health, and safety impacts of alternatives to ozone depleting solvents", Proc., Annu. Meet.–Air Waste Manage. Assoc., 85th (vol. 15), paper No. 92/93.03, pp. 1–16, Month not known–1992.
American Chemical Society, reg. nos. 123–54–6, 17272–66–1, and 13395–16–9, Month not known–1997.
Kirk–Othmer, Encyclopedia of Chemical Technology, 4th ed., John Wiley & Sons, vol. 5, pp. 764–795, Month not known–1993.

*Primary Examiner*—Douglas J. McGinty

[57] ABSTRACT

The specification describes a cleaning process for electronic devices and assemblies such as printed wiring boards. In the cleaning process deterioration of a terpene based cleaning solution, as evidenced by yellowing, is prevented using a copper chelating additive.

1 Claim, 2 Drawing Sheets

CLEANING WITH LIMONENE, BHT, AND ACETYLACETONATE

FIELD OF THE INVENTION

The field of this invention is cleaning techniques, especially those designed for cleaning electrical assemblies and subassemblies such as printed wiring boards.

BACKGROUND OF THE INVENTION

The technology of packaging and mounting electrical and electroptic devices and subassemblies has witnessed remarkable innovations on many fronts. However, some basic tools remain entrenched. One of these is the use of solder in mounted components on printed wiring boards (PWBs). Devices and subassemblies are through-hole mounted in significant areas of the industry, and surface mount technology also relies heavily on soldered connections. An aspect of the use of solder in PWB manufacture that also remains relatively unchanged is the use of solder fluxes, and the need for cleaning solder flux residues from soldered PWBs. The flux most commonly used, both in wave soldering where the flux is applied before soldering, and in reflow soldering, where the flux is contained in the solder, is non-corrosive rosin (NCR). Attempts to develop fluxless solders, which eliminate the need for post solder cleaning operations, have been successful in some applications but solder fluxes, i.e. rosins, are still widely used in industry. While rosin is an effective solder flux it is not water soluble, and is difficult to remove, especially on irregular surfaces such as PWBs.

For many years halogenated materials—in particular chlorinated fluorocarbons—were used for cleaning rosin residues in PWB manufacture. These halogen materials are strong solvents. Related halogen solvents like trichloroethylene and perchloroethylene were also used in this industry. However the widespread move in industry to purge the use of fluorocarbons for environmental reasons, and the discovery that the chlorinated ethylene solvents were suspected carcinogens, stimulated attempts to develop substitute cleaning materials.

Among the first such substitutions were aqueous detergents designed to saponify rosin fluxes so they could be removed with a water rinse. The detergents were less hazardous to workers and the environment than the halogenated materials but they involved a high volume of waste water and the waste solutions were high in pH. Such active bases easily complexed with heavy metals and also had high biochemical oxygen demand. Accordingly they required neutralization prior to disposition, and disposal costs were high.

A relatively new class of substitute materials that has been successful and now widely adopted in industry are described in U.S. Pat. Nos. 4,640,719 and 4,740,247 which are incorporated herein by reference. These effective cleaning solutions contain terpenes as the active ingredient. Terpenes are water soluble, biodegradable, non-toxic, naturally occurring, substances that are harmless to the environment. Commercial forms of these cleaning materials are designated by EC followed by a number, e.g. EC-7, and are available from Petroferm, Inc. Among the terpene materials recommended are limonenes (d-limonene and 1-limonene) and dipentenes. It is recommended that a surfactant be included to emulsify the terpene to facilitate complete removal of the cleaning agent in a standard rinse operation. These emulsifying agents may be one or more of these compounds: ethoxylated alkylphenols, alkyl and dialkyl succinates, polysorbate esters, linear alkyl benzene sulfonates, linear or branched chain alcoholic ethoxylates and ethoxysulfates. The amount of emulsifying surfactant is not critical and is typically in the range 0–40%. It is also recommended that the cleaning solution include one or more antioxidants to prevent the terpene ingredient from oxidizing. Among the antioxidants that have been used is BHT (2,6-Di (t-butyl)-4-methylphenol.

The commercially available EC-7 material is highly effective and at 35–50% concentration the rosin loading capacity is approximately equal to the weight of the cleaning solution. The EC-7 cleaning agent is easily rinsed with deionized water.

STATEMENT OF THE INVENTION

While terpene based cleaning agents have few drawbacks it has been discovered that these solutions age poorly in some applications. Specifically, I have found that they oxidize rapidly in the presence of copper. Even trace amounts of copper turn the solutions yellow and limit their useful lifetime. This problem is serious because most PWBs contain copper either in the components or in the interconnect levels of the wiring board.

I have additionally discovered that the oxidation of these solutions is attributable to copper catalyzed chemical conversion of the antioxidant component of the cleaning solution rendering it ineffective. Without an effective antioxidant stabilizer the active terpene constituent oxidizes rapidly and the solution is effectively spent. I have solved this oxidation problem by adding to the cleaning solution a copper chelating agent which complexes with copper ions and prevents the catalytic effect of copper in oxidizing the d-limonene.

DETAILED DESCRIPTION

Figure 1:
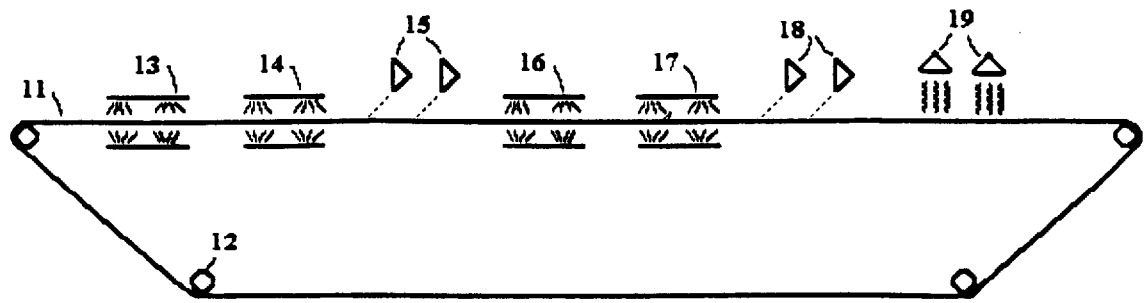
FIG. 1 is a schematic view of a cleaning apparatus useful for cleaning electronic assemblies such as PWBs using the cleaning solutions of this invention.

FIG. 1 shows a typical installation of a PWB cleaning process. The PWBs are loading onto conveyor 11 driven by drive rollers 12. The boards enter a first low pressure wash 13, then a high pressure wash 14 both using the cleaning solution of the invention. Air knives 15 remove excess cleaning solutions and the boards then enter a first low pressure rinse 16, then a high pressure rinse 17 both using room temperature deionized water. Air knives 18 remove excess rinse water and the boards are dried with infra-red lamps indicated at 19.

Recommended cleaning solutions are terpene based solutions. In the examples that follow the cleaning solution was EC-7R available commercially from Petraferm, Inc. of Fernandina Beach, Fla. The EC-7R solution is approximately 90% by weight of d-limonene and 10% by weight of an aliphatic ester surfactant, e.g. methyl laurate. The antioxidant comprises BHT in an effective amount, i.e. 0.05% to 1.0%. The amount of terpene may vary substantially depending on the cleaning application and other factors. Solutions with as little as 5% by weight terpene or as much as 95% by weight can be used.

Figure 2:
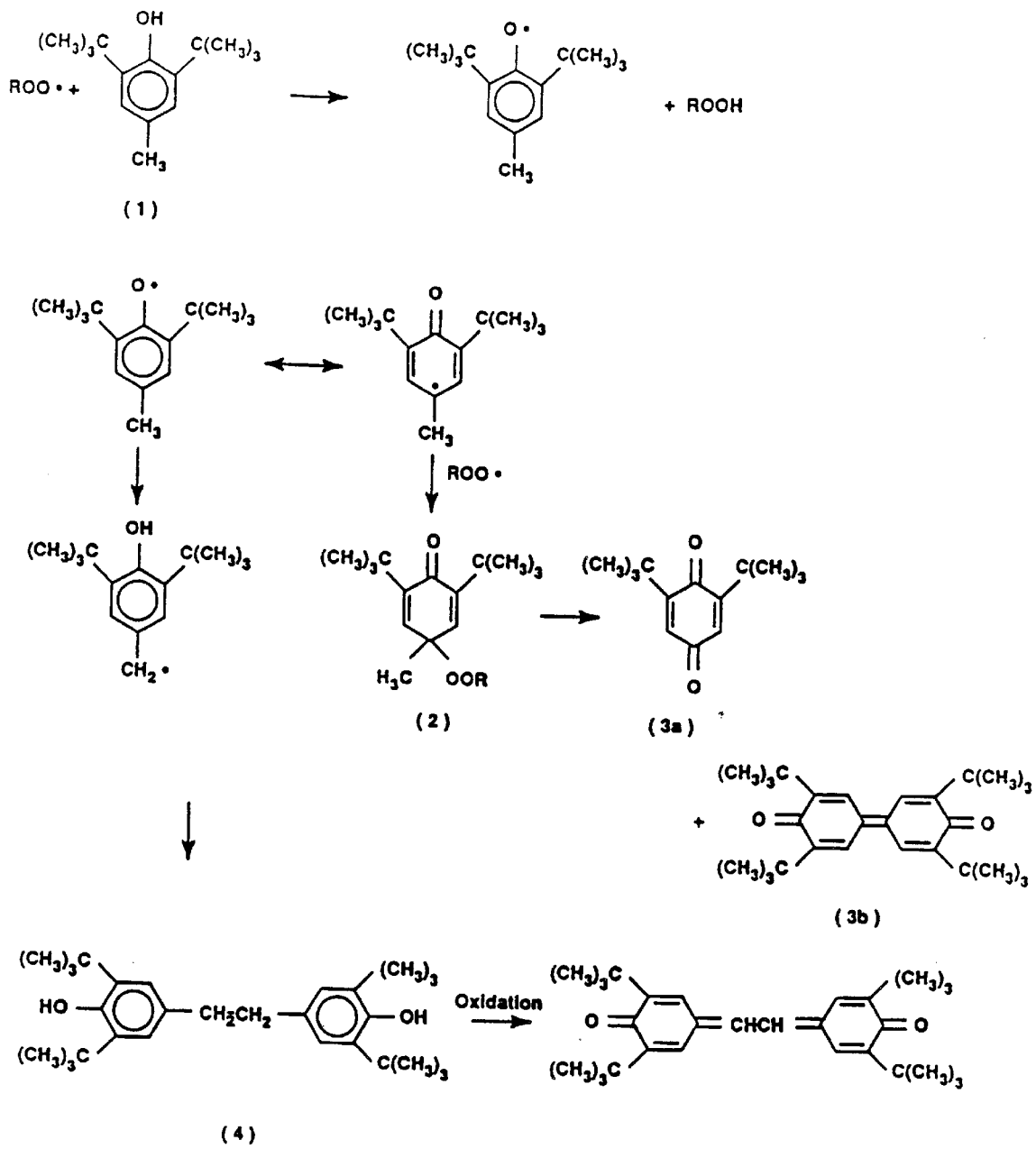
FIG. 2 shows the chemical transformations of the copper catalyzed conversion of a typical antioxidant.

The EC-7R solution was used in an apparatus similar to that shown in FIG. 1 for a period of several days to a few weeks until yellowing occurred and the solution was discarded. The yellowing was evidence of deterioration of the cleaning ability of the solution and was attributed to the catalytic reaction shown in FIG. 2. The antioxidant used, 2,6-Di(t-butyl)-4-methyl-phenol, undergoes successive transformations and oxidations to yield the di-toluene structure shown at (4). This compound undergoes oxidation to a quinone structure, stilbenequinone, which has visible absorption peaks at 452 nm and 420 nm (yellow).

The foregoing reaction and theory is postulated for the antioxidant BHT and is given by way of example. Similar copper catalyzed reactions may occur with other antioxidant materials. The solution to this problem according to my invention is to add a copper chelating agent to the cleaning solution. The chelating agent complexes with copper ions by known reactions and renders the copper ions incapable of further catalytic action and destruction of the effectiveness of the antioxidant. Among effective chelating agents are N,N"-(disalicylidene)-1,2-propanediamnine (DSPDA), citric acid, phosphoric acid, ethylenediaminetetraacetic acid (EDTA), acetylacetonate. Other known chelating agents may also be used.

Figure 3:
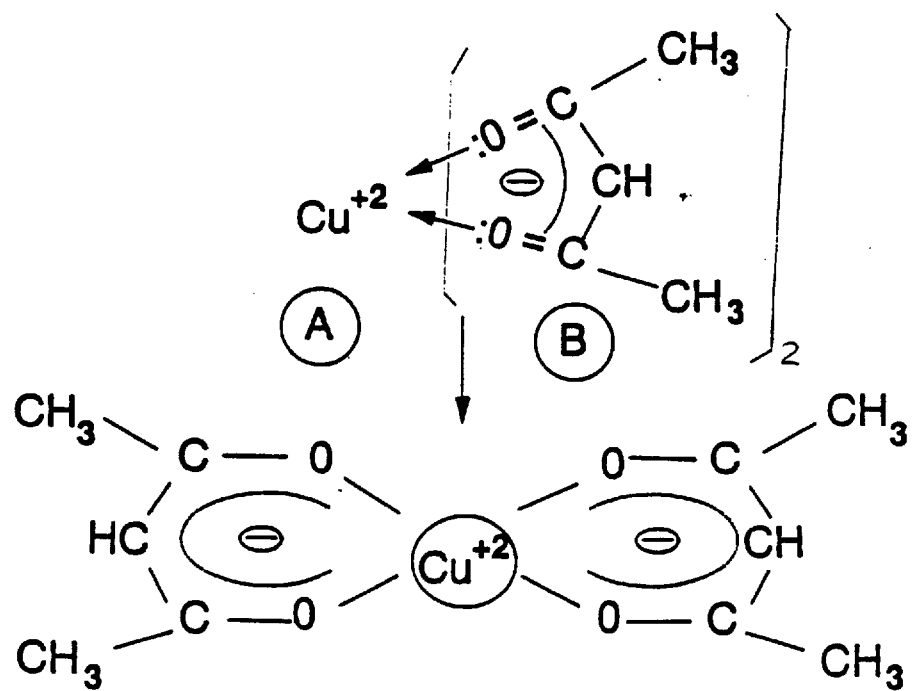
FIG. 3 shows the chelation reaction between copper ions that contaminate the cleaning solution and the chelating agent added to neutralize those ions.

The effectiveness of the invention was demonstrated using acetylacetonate as the additive to a solution of EC-7R. FIG. 3 shows the chelation reaction between copper ions and acetylacetonate, The resulting copper chelate complex effectively neutralizes the copper ions with respect to their ability to catalyze antioxidant destruction and yellow the cleaning solution.

The demonstration involved immersing a strip of copper foil in an EC-7R cleaning solution with no chelating agent, and comparing the time to yellow with solutions containing acetylacetonate in various amounts. The results are shown in Table 1 and demonstrate that acetylacetonate in an amount of 1.2% and 2.4% is effective.

TABLE 1

Organic Chelate for Preventing Yellowing of the EC-7R With a Copper Strip

| Samples with a Strip of Copper Foil | EC-7R Time to Yellow | | |
|---|---|---|---|
| | 1 Month | 2 Months | 3 Months |
| Control (EC-7R Only) | (1 day) | | |
| EC-7R + 0.3% by wt. Hacac | 1 month | | |
| EC-7R + 0.6% by wt. Hacac | | | light yellow |
| EC-7R + 1.2% | clear | clear | clear |
| EC-7R + 2.4% | clear | clear | clear |

On the basis of these tests an effective amount of chelating agent additive is considered to be 0.1–5.0%

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. A method for cleaning a printed wiring board which contains copper interconnections the method comprising the steps of exposing the printed wiring board to a cleaning solution, and rinsing the cleaning solution from the printed wiring board, said cleaning solution comprising:

5–95 weight % of a terpene selected from the group consisting of d-limonene, l-limonene, and dipentene, 0.05–1.0% 2,6-di(t-butyl)-4-methyl-phenol, and 1.2–5.0 weight % of acetylacetonate.

* * * * *